US007013553B2

(12) United States Patent
Elgin, II et al.

(10) Patent No.: US 7,013,553 B2
(45) Date of Patent: Mar. 21, 2006

(54) SUPERCONDUCTING MAGNET COIL SUPPORT STRUCTURE

(75) Inventors: Stephen R. Elgin, II, Florence, SC (US); Michael L. Allford, Florence, SC (US); Michael R. Eggleston, Florence, SC (US)

(73) Assignee: General Electric Company, Schnectady, NY (US)

( * ) Notice: Subject to any disclaimer, the term of this patent is extended or adjusted under 35 U.S.C. 154(b) by 0 days.

(21) Appl. No.: 10/604,521

(22) Filed: Jul. 28, 2003

(65) Prior Publication Data

US 2004/0178871 A1     Sep. 16, 2004

Related U.S. Application Data

(63) Continuation-in-part of application No. 09/681,888, filed on Jun. 20, 2001, now abandoned.

(51) Int. Cl.
H01H 39/24        (2006.01)

(52) U.S. Cl. .......................... 29/599; 335/216; 335/296

(58) Field of Classification Search .................. 29/599, 29/602.1; 335/216, 296–299, 302–306
See application file for complete search history.

(56) References Cited

U.S. PATENT DOCUMENTS

| 4,009,459 | A | * | 2/1977 | Benson et al. | ............... 335/300 |
| 6,157,276 | A | * | 12/2000 | Hedeen et al. | ............... 335/216 |
| 6,211,676 | B1 | * | 4/2001 | Byrne et al. | ................ 324/319 |
| 2004/0051612 | A1 | * | 3/2004 | Herndon et al. | ............ 335/299 |

* cited by examiner

Primary Examiner—Bernard Rojas
(74) Attorney, Agent, or Firm—Michael Della Penna

(57) ABSTRACT

A superconducting magnet coil support structure (20) includes a solid body (21) having an exterior side (24), an interior portion (26), and an interior side (28). The interior portion has a base (36) that is formed of a first resin material. The exterior side (24) has multiple spacers (32) and multiple pockets (34) with dimensions that correspond to dimensions of a superconducting magnet (14). The spacers (32) are coupled to the base (36) and are formed of a second resin material. The exterior side (24), the interior portion (26), and the interior side (28) include varying width material.

11 Claims, 3 Drawing Sheets

SUPERCONDUCTING MAGNET COIL SUPPORT STRUCTURE

CROSS REFERENCE TO RELATED APPLICATIONS

The present application is a continuation-in-part of U.S. patent application Ser. No. 09/681,888, filed on Jun. 20, 2001 now abandoned, entitled "SUPERCONDUCTING MAGNET COIL SUPPORT STRUCTURE", which is incorporated by reference herein.

BACKGROUND OF INVENTION

The present invention relates generally to a superconducting magnet coil support structure. More particularly, the present invention relates to a method and apparatus for supporting a superconducting magnet in a Magnetic Resonance Imager (MRI) System.

Current Magnetic Resonance Imager (MRI) systems include a superconducting magnet that generates a temporally constant primary magnetic field. The superconducting magnet is used in conjunction with a magnetic gradient coil assembly, which is sequentially pulsed to create a sequence of controlled gradients in the static magnetic field during a MRI data gathering sequence. The superconducting magnet and the magnetic gradient coil assembly have a radio frequency (RF) shield disposed therebetween. The controlled sequential gradients are effectuated throughout a patient imaging volume (patient bore), which is coupled to at least one MRI (RF) coil or antennae. The RF coils are located between the magnetic gradient coil assembly and the patient bore.

As a part of a typical MRI, RF signals of suitable frequencies are transmitted into the patient bore. Nuclear magnetic resonance (nMR) responsive RF signals are received from the patient bore via the RF coils. Information encoded within the frequency and phase parameters of the received RF signals, by the use of a RF circuit, is processed to form visual images. These visual images represent the distribution of nMR nuclei within a cross-section or volume of a patient being scanned within the patient bore.

In current MRI systems, the superconducting magnet includes a plurality of superconducting magnet coils. The superconducting magnet is supported by a superconducting magnet coil support structure within a toroidal helium vessel. When the superconducting magnet suddenly quits carrying a charge or current, quench forces result, causing the superconducting magnet coils to move. The superconducting magnet coil support structure maintains the superconducting magnet coils tight and snug as to prevent movement.

In the production of current MRI systems, fiberglass cloth is used to build the superconducting magnet coil support structure. The superconducting magnet coil support structure is formed during a traditional wet winding process. During the traditional wet winding process, fiberglass is applied to and wound around a cylindrical shaped mandrel. The mandrel is large in size to accommodate size of the superconducting magnet coil support structure. The mandrel is typically formed of steel using a machining process in order to form a mandrel that is capable of withstanding pressures and temperatures experienced during formation of the superconducting magnet coil support structure.

Some other techniques of forming a tooling exist, such as stereolithography. Stereolithography techniques and the like are intended for the formation of relatively small components. Equipment utilized within these techniques is currently incapable of forming a tooling large enough to accommodate a superconducting magnet coil support structure. Also, such techniques are simply impractical for the formation of a superconducting magnet coil support structure, since in doing so would result in a large amount of wasted material.

Several layers of standard sized fiber cloth having a standard width are dipped into a liquid epoxy and applied to the mandrel. The fiberglass is allowed to cure to form a superconducting magnet coil support structure having a solid body. The superconducting magnet coil support structure is removed from the mandrel. Pockets are then cut in the exterior side of the superconducting magnet coil support structure to support the superconducting magnet. The dimensions and geometries of the pockets correspond to the dimensions and geometries of the superconducting magnet coils. Spacers remain between pockets in the superconducting magnet coil support structure to fill gaps between adjacent superconducting magnet coils. The closely matching dimensions and geometries allows the superconducting magnet coil support structure to maintain the superconducting magnet tight and snug as to prevent freedom of movement.

Superconducting magnet coils that have non-standard dimensions may require pockets in the superconducting magnet coil support structure, which are deeper and narrower than standard pocket depths and widths. The non-standard dimensions are more difficult to cut out then the standard dimensions. Thus, specialized tooling and equipment is necessary to continue using the traditional wet winding process, increasing time and expense involved therein. Also, in order to efficiently and reliably utilize the specialized tooling and equipment, additional technician training time and expense would be incurred. The difficulty level is sufficient and known to one skilled in the art, to cause the traditional process used to create the superconducting magnet coil support structure having non-standard dimensions to be infeasible and obsolete.

The traditional wet winding process is also unstable, inaccurate, and inefficient for the following reasons. The fiberglass cloth is free to move throughout the wet winding process causing voids and incorrect dimensions of the superconducting magnet coil support structure. These inaccuracies are increased for a superconducting magnet coil support structure having non-standard dimensions. The voids are usually filled with epoxy. Extra time and expense is thus required to rework the superconducting magnet coil support structures.

It would therefore be desirable to provide a method of fabricating a superconducting magnet coil support structure in a MRI system that is more stable, accurate, efficient, and cost reductive relative to the current process used. It would also be desirable for the method to be adaptable for various non-standard geometries and dimensions of the superconducting magnet.

SUMMARY OF INVENTION

It is therefore an advantage of the present invention to provide a method of fabricating a superconducting magnet coil support structure for a magnetic resonance imager (MRI) system that is adaptable for various non-standard geometries and dimensions of a superconducting magnet.

A superconducting magnet coil support structure is provided. The superconducting magnet coil support structure includes a solid body having an exterior side, an interior portion, and an interior side. The interior portion has a base that is formed of a first resin material. The exterior side has multiple spacers and multiple pockets with dimensions that correspond to dimensions of a superconducting magnet. The spacers are coupled to the base and are formed of a second resin material. The exterior side, the interior portion, and the interior side include varying width material. The present invention also provides a method of fabricating the same.

One advantage of the present invention is that it is versatile, since it may be applied to various MRI systems with varying superconducting magnet dimensions and geometries. The present invention provides increased accuracy, efficiency, and reduces costs in fabrication of a superconducting magnet coil support structure.

Another advantage of the invention, is its ability to vary the width of the fiberglass cloth during superconducting magnet coil support structure formation. By varying the fiberglass cloth width, the correct final dimensions of the superconducting magnet coil support structure are achieved and accurate coil placement is provided.

A further advantage of the present invention is that the preform support tooling used therein stabilizes the wound fiberglass cloth to create accurate windings of the fiberglass cloth. The preform support tooling also provides a restraint to prevent layer-to-layer separation, which can create weak areas in the superconducting magnet coil support structure. The tooling also allows for larger radial builds, that are not possible using the traditional wet winding process.

The present invention itself, together with further objects and attendant advantages, is best understood by reference to the following detailed description, taken in conjunction with the accompanying drawing.

DETAILED DESCRIPTION

The present invention is described herein with respect to an apparatus and a fabricating method for producing a superconducting magnet coil support structure. However, it will be understood that the following is capable of being adapted for various purposes and is not limited to the following applications; namely magnetic resonance imager (MRI) systems, magnetic resonance spectroscopy systems, and other applications that require use of a magnet support structure.

Figure 1:
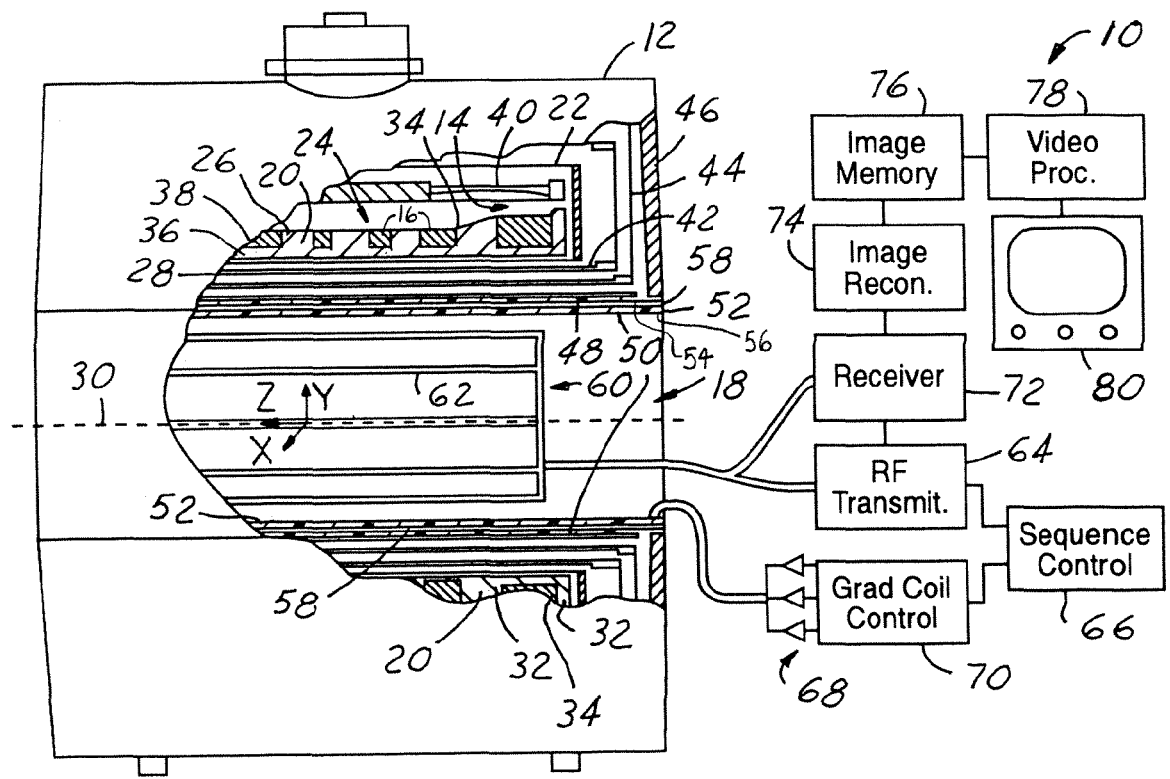
FIG. 1 is a block diagrammatic view of a magnetic resonance imager (MRI) system, utilizing a superconducting magnet coil support structure.

Referring now to FIG. 1, a block diagrammatic view of an MRI system 10. The MRI system 10 includes a static magnet structure 12 (a cylindrical structure) has a superconducting magnet 14 with multiple superconducting magnetic field coils 16, which generate a temporally constant magnetic field along a longitudinal axis (z-axis) of a central bore 18 (patient bore). The superconducting magnet coils 16 are supported by a superconducting magnet coil support structure 20 and received in a toroidal helium vessel or can 22.

The superconducting magnet coil support structure 20 provides support for static loads and allows fabrication and accurate placement of coils 16. Only one superconducting magnet 14 and one superconducting magnet coil support structure 20 are shown, however, the disclosed system may have multiple superconducting magnets and superconducting magnet coil support structures.

The superconducting magnet coil support structure 20 includes a solid body 21 that has an exterior side 24, an interior portion 26, and an interior side 28. The exterior side 24 is the longitudinal side farthest away from the center 30 of the patient bore 18 that supports the superconducting magnet 14. The exterior side 24 has multiple spacers 32 and multiple pockets 34. The spacers 32 and the pockets 34 have dimensions corresponding to dimensions of the superconducting magnet 14. The interior portion 26 has a base 36. The spacers 32 are integrally connected to the external side 38 of the base 36. The interior side 28 is preferably cylindrical shaped and is the side closest to the center 30 of the patient bore 14.

A main magnetic field shield coil assembly 40 generates a magnetic field that opposes the field generated by the superconducting magnet coils 16. A first coil shield 42 surrounds the helium vessel 22 to reduce "boil-off". A second coil shield 44 surrounds the first coil shield 42. Both the first coil shield 42 and the second coil shield 44 are preferably cooled by mechanical refrigeration. The first coil shield 42 and the second coil shield 44 encase a toroidal vacuum vessel 46. The toroidal vacuum vessel 46 includes a cylindrical member 48 that defines the patient bore 18 and extends parallel to a longitudinal axis. On a first exterior side 50 of the cylindrical member 48, which is longitudinal side farthest away from the center 30 of the patient bore 18, is a magnetic gradient coil assembly 52. Located on a second exterior side 54 of the magnetic gradient coil assembly 52 is a cylindrical dielectric former 56. A RF shield 58 is applied to the cylindrical dielectric former 56.

The patient bore 18 has a RF coil assembly 60 (antennae) mounted therein. The RF coil assembly 60 includes a primary RF coil 62 and the RF shield 58.

A RF transmitter 64 is connected to a sequence controller 66 and the primary RF coil 62. The RF transmitter 64 is may be digital. The sequence controller 66 controls a series of current pulse generators 68 via a gradient coil controller 70 that is connected to the magnetic gradient coil assembly 52. The RF transmitter 64 in conjunction with the sequence controller 66 generates pulses of radio frequency signals for excitation and manipulation of magnetic resonance in selected dipoles of a portion of the subject within the patient bore 18.

A radio frequency receiver 72 is connected with the primary RF coil 62 for demodulating magnetic resonance signals emanating from an examined portion of the subject. An image reconstruction apparatus 74 reconstructs the received magnetic resonance signals into an electronic image representation that is stored in an image memory 76. A video processor 78 converts stored electronic images into an appropriate format for display on a video monitor 80.

Figure 2:
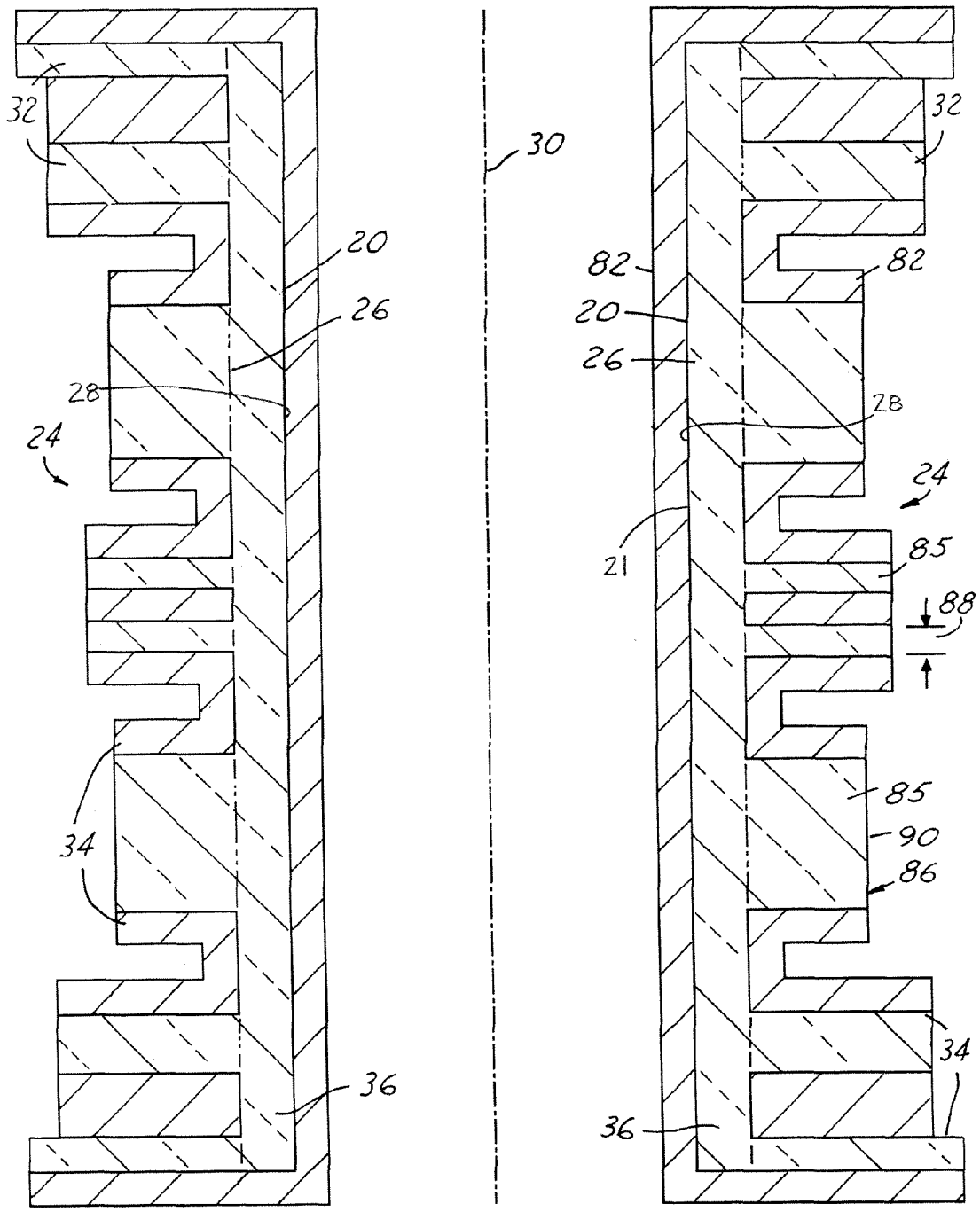
FIG. 2 is an enlarged, detailed cross-sectional view of a superconducting magnet coil support structure within a preformed support tooling constructed in accordance with a preferred embodiment of the present invention.

Referring now to FIG. 2, an enlarged detailed cross-sectional view of the superconducting magnet coil support structure 20 having the exterior side 24, the interior portion 26, and the interior side 28 is shown within a preformed support tooling 82.

The exterior side 24 includes the spacers 32 and the pockets 34. Each spacer 32 occupies a space 85 located between two adjacent superconducting magnet coils 16. Each spacer 32 has a defined spacer height 86 and a defined spacer width 88. The spacer height 86 corresponds to a coil thickness of a particular coil of the superconducting magnet coils 16. The spacer height 86 is measured from an external side 38 of the base 36 to an outer side 90 of each spacer 32. The spacer width 88 corresponds to a particular gap between superconducting magnet coils 16. Each pocket 34 holds a particular coil of the plurality of superconducting magnet coils 16. Each pocket 34 has a pocket depth 94 and a pocket width 96. Each pocket depth 94 is equal to the smallest adjacent spacer height 86 and corresponds to a coil thickness of a particular superconducting magnet coil 16 that is cupped by a corresponding pocket 34.

The preformed support tooling 82 is designed and fabricated to be used and to withstand pressures and temperatures incurred in forming the superconducting magnet coil support structure 20. The preformed support tooling is preferably fabricated out of carbon steel using a method known to one skilled in the art.

Figure 3:
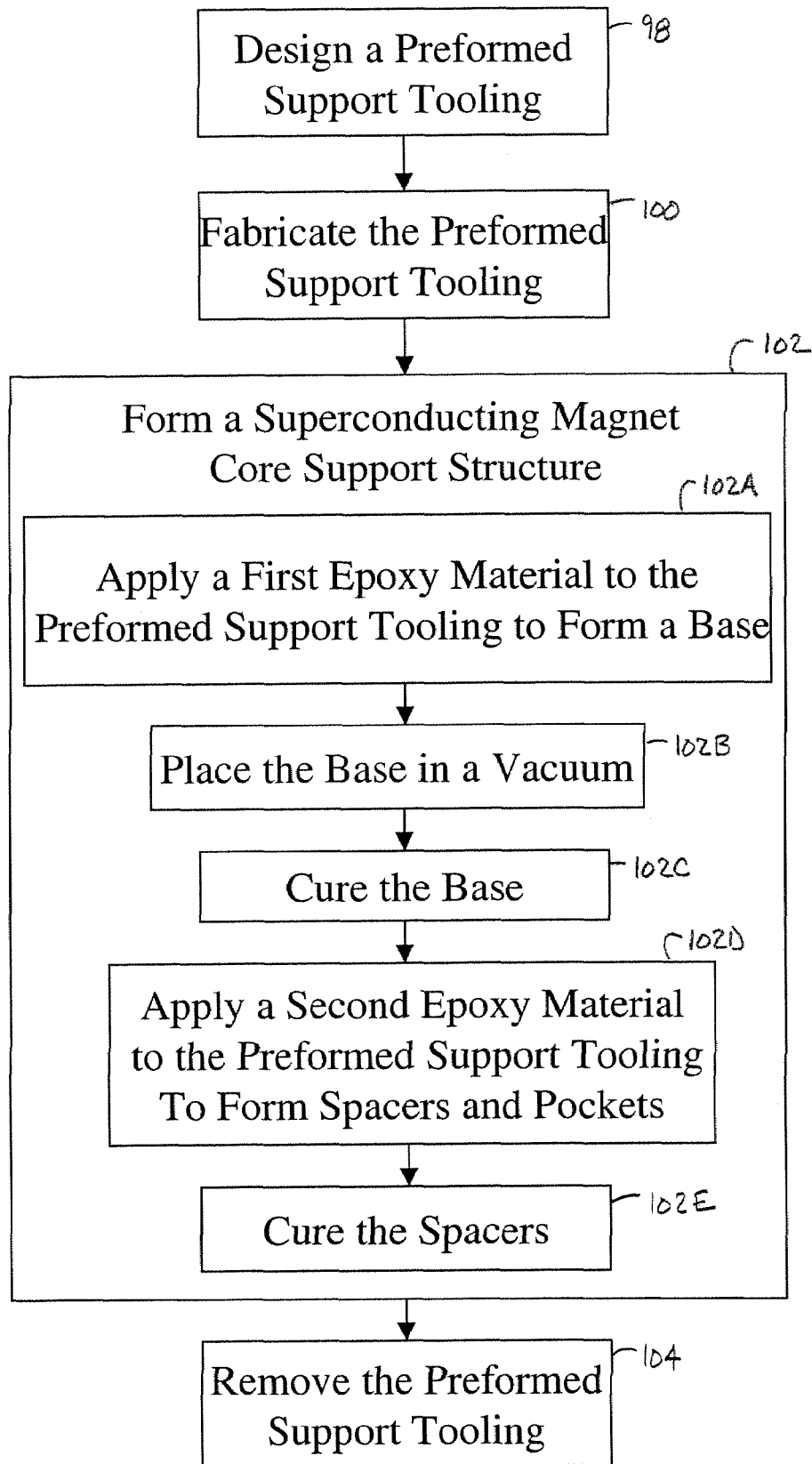
FIG. 3 is a flow chart illustrating a method for constructing a superconducting magnet coil support structure in accordance with a preferred embodiment of the present invention.

Referring now to FIG. 3, a method of fabricating the superconducting magnet coil support structure 20 is shown.

In step 98, the preformed support tooling 82 is designed. Initially, the design dimensions and geometries of the superconducting magnet 14 are determined. Thereafter, the dimensions of space available for the superconducting magnet coil support structure 20 in the toroidal helium vessel 22 are also determined. Based on the size of the superconducting magnet 14, a mounting configuration of the superconducting magnet coil support structure 20 is determined. The superconducting magnet coil support structure 20 is designed to accommodate for the dimensions and geometries of, the dimensions of space available for, and the mounting configuration of the superconducting magnet 14. The dimensions of the superconducting magnet coil support structure 20 are used to design the dimensions of the preformed support tooling 82.

In step 100, the preformed support tooling 82 is fabricated to match the dimensions determined for the preformed support tooling 20 in step 98. A mold release is built into or applied to the preformed support tooling 82 to ease in the removal of the preformed support tooling 82 from the superconducting magnet coil support structure 20.

In step 102, the superconducting magnet coil support structure 20 is formed. The superconducting magnet coil support structure 20 is formed using a wet winding process having multiple curing stages.

In step 102A, a first epoxy material, such as prepreg, is applied to the preformed support tooling to form the base 36. Although prepreg is used for added strength and density to form the base 36, E-glass, S-glass, or other fiberglass material may be used. Prepreg consists of a fiberglass tape with epoxy, as known in the art. The base 36 is a hard rigged structure, which provides structural support. In step 102B, the base 36 is placed into a vacuum to remove the air from the prepreg material, thereby reducing air pockets and improving strength of base 36. In step 102C, the base 36 is then pre-cured in an oven to allow the base 36 to become a hard rigged structure. The precuring of the base provides more accurate coil placement.

In step 102D, after curing the base 36 a second epoxy material, such as fiber cloth, is dipped into a liquid epoxy and applied to the base 36 forming fiberglass layers. The fiber cloth may be an interlaced fabric having hoop fibers and axial fibers. The second epoxy material may be E-glass, S-glass, or other type of fiberglass material used in the art. The fiberglass cloth is wound around the base 36 and form layers of fiberglass on the base 36. The layers of fiberglass cloth are stacked to form the plurality of spacers 32. The fiberglass material may be optimized for different loadings. The above-described process may be cost optimized for both the first epoxy material and the second epoxy material.

Traditionally, standard width fiberglass cloth satisfies the geometries and dimensions of a standard superconducting magnet. On the other hand, the standard width of the fiberglass cloth does not satisfy a superconducting magnet having non-standard geometries and dimensions. As the standard width fiberglass cloth is wrapped around the preformed support tooling, for a MRI system having a non-standard superconducting magnet, each wrapping may overlap causing the final dimensions of the superconducting magnet coil support structure to deviate from the correct dimensions.

The present invention varies the width of the fiber cloth depending on the dimensions of the spacers 32 and the pockets 34 for the fiberglass applied area of the preformed support tooling 82. The preform support tooling 82 stabilizes the positioning of the wound fiberglass cloth. The design of the tooling restricts where the fiberglass cloth can be applied. The restriction allows the wet winding process to be precise and accurate.

In step 102E, the fiberglass layers are allowed to cure within the preformed support tooling 82. The preform support tooling provides a restraint to prevent layer-to-layer separation during curing of the superconducting magnet coil support structure 20, which can create weak areas in the superconducting magnet coil support structure 20.

In step 104, the preformed support tooling 82 is removed from the superconducting magnet coil support structure 20. Since the superconducting magnet coil support structure 20 has been formed within a tooling designed for a specific application, it does not require any reworking, unlike in traditional wet winding processes.

By varying the width of the fiber cloth and by taking advantage of the preformed support tooling 82 the present invention provides a method of fabricating a superconducting magnet coil support structure that is more accurate, stable, and efficient than that of traditional wet winding processes. Additionally, the present invention may be used to fabricate standard and non-standard sized superconducting magnets 14.

The above-described apparatus and manufacturing method, to one skilled in the art, is capable of being adapted for various purposes and is not limited to applications; including MRI systems, magnetic resonance spectroscopy systems, and other applications that require use of a magnet support structure. The above-described invention can also be varied without deviating from the true scope of the invention.

While particular embodiments of the invention have been shown and described, numerous variations alternate embodiments will occur to those skilled in the art. Accordingly, it is intended that the invention be limited only in terms of the appended claims.

What is claimed is:

1. A method of fabricating a superconducting magnet coil support structure comprising:

designing a preformed support tooling for the superconducting magnet coil support structure;

fabricating said preformed support tooling;

performing a wet winding process to form said superconducting magnet coil support structure comprising;

winding a first resin material onto said preformed support tooling to form a base;

applying a second resin material different from said first resin material onto said base to form a plurality of spacers and a plurality of pockets on said base; and curing said superconducting magnet coil support structure; and removing said preformed support tooling from said superconducting magnet coil support structure.

2. A method as in claim 1 wherein the step of designing said preformed support tooling further comprising:

determining dimensions of the superconducting magnet;

determining dimensions of space available for said superconducting magnet coil support structure;

determining a mounting configuration of said superconducting magnet coil support structure;

designing dimensions of said superconducting magnet coil support structure to accommodate for said dimensions of said superconducting magnet, said dimensions of space available, and said mounting configuration; and designing dimensions of said preformed support tooling.

3. A method as in claim 1 wherein the step of performing a wet winding process further comprises:

winding prepreg onto said preformed support tooling to form a base; and applying fiber cloth onto said base to form a plurality of spacers and a plurality of pockets on said base.

4. A method as in claim 1 wherein the step of performing a wet winding process further comprises:

winding said first resin material onto said preformed support tooling to form a base; then inserting said base into a vacuum chamber;

curing said base; and applying said second resin material onto said base.

5. A method as in claim 1 wherein applying a first resin material and applying a second resin material comprises applying a resin material selected from at least one of prepreg, E-glass, S-glass, fiberglass tape with epoxy, fiber cloth with epoxy, and fiber strands with epoxy.

6. A method as in claim 1 wherein the step of performing a wet winding process further comprises winding fiber cloth having strands of fiber onto said preformed support tooling.

7. A method as in claim 6 wherein the step of winding fiber cloth onto said preformed support tooling further comprises varying the widths of said fiber cloth to form said plurality of spacers and said plurality of pockets.

8. A method as is claim 7 wherein the step of forming said plurality of spacers further comprises matching the dimensions and geometries of said plurality of spacers to the dimensions and geometries, respectively, of gaps between superconducting magnet coils.

9. A method as is claim 7 wherein the step of forming said plurality of pockets further comprises matching the dimensions and geometries of said plurality of pockets to the dimensions and geometries of said superconducting magnet.

10. A method as in claim 6 wherein the step of winding fiber cloth is performed by a computer numerically controlled (CNC) multi-axis winder.

11. A superconducting magnet coil support structure formed according to the method of claim 1.

* * * * *